United States Patent
Zhu et al.

(10) Patent No.: US 12,488,965 B2
(45) Date of Patent: Dec. 2, 2025

(54) DEVICE AND METHOD FOR TREATING SUBSTRATE

(71) Applicant: TAIWAN SEMICONDUCTOR MANUFACTURING COMPANY, LTD., Hsinchu (TW)

(72) Inventors: Zi-Wei Zhu, Hsinchu (TW); Shao-Yong Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 890 days.

(21) Appl. No.: 17/730,813

(22) Filed: Apr. 27, 2022

(65) Prior Publication Data

US 2023/0352277 A1    Nov. 2, 2023

(51) Int. Cl.
*H01J 37/32*  (2006.01)
*H01L 21/683*  (2006.01)
*H05B 1/02*  (2006.01)

(52) U.S. Cl.
CPC .. *H01J 37/32642* (2013.01); *H01J 37/32724* (2013.01); *H01L 21/6833* (2013.01); *H05B 1/0233* (2013.01); *H01J 2237/3341* (2013.01)

(58) Field of Classification Search
CPC ........... H01J 37/32715; H01J 37/32642; H01J 37/32449; H01J 37/32532; H01J 37/32467; H01J 37/32651; H01J 37/32477
See application file for complete search history.

(56) References Cited

U.S. PATENT DOCUMENTS

2004/0053428 A1*  3/2004  Steger ............... H01J 37/32642 438/10

* cited by examiner

*Primary Examiner* — Robert G Bachner
(74) *Attorney, Agent, or Firm* — Birch, Stewart, Kolasch & Birch, LLP (57) ABSTRACT

A device includes a substrate retainer for retaining a substrate thereon, and a ring assembly including an upper ring which has a plurality of upper ring segments that are angularly displaced from each other. Each of the upper ring segments is movable between an inner position and an outer position so as to adjust a gap between an outer periphery of the substrate and an inner edge of each of the upper ring segments when the substrate is retained on the substrate retainer.

20 Claims, 10 Drawing Sheets

DEVICE AND METHOD FOR TREATING SUBSTRATE

BACKGROUND

With scaling down of a size of a die (or chip) and increase in a diameter of a wafer, more dies are formed at an edge of a circular wafer. Therefore, process condition at the edge of a wafer has become a critical factor in advanced semiconductor technologies, and there is continuous demand to develop apparatuses and/or methods to improve uniformity (e.g., uniformity of critical dimension, thickness, etc.) at the edge of the wafer in order to improve die availability (i.e., die yield).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "below," "upper," "lower," "top," "bottom," "inner," "outer," "inward," "outward," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a semiconductor manufacturing process, a substrate (for example, but not limited to, a silicon wafer) is subsequently transported to various devices to be subjected to various treatments, such as etching processes, heating processes, depositing processes, cleaning processes, and so on.

Figure 1:
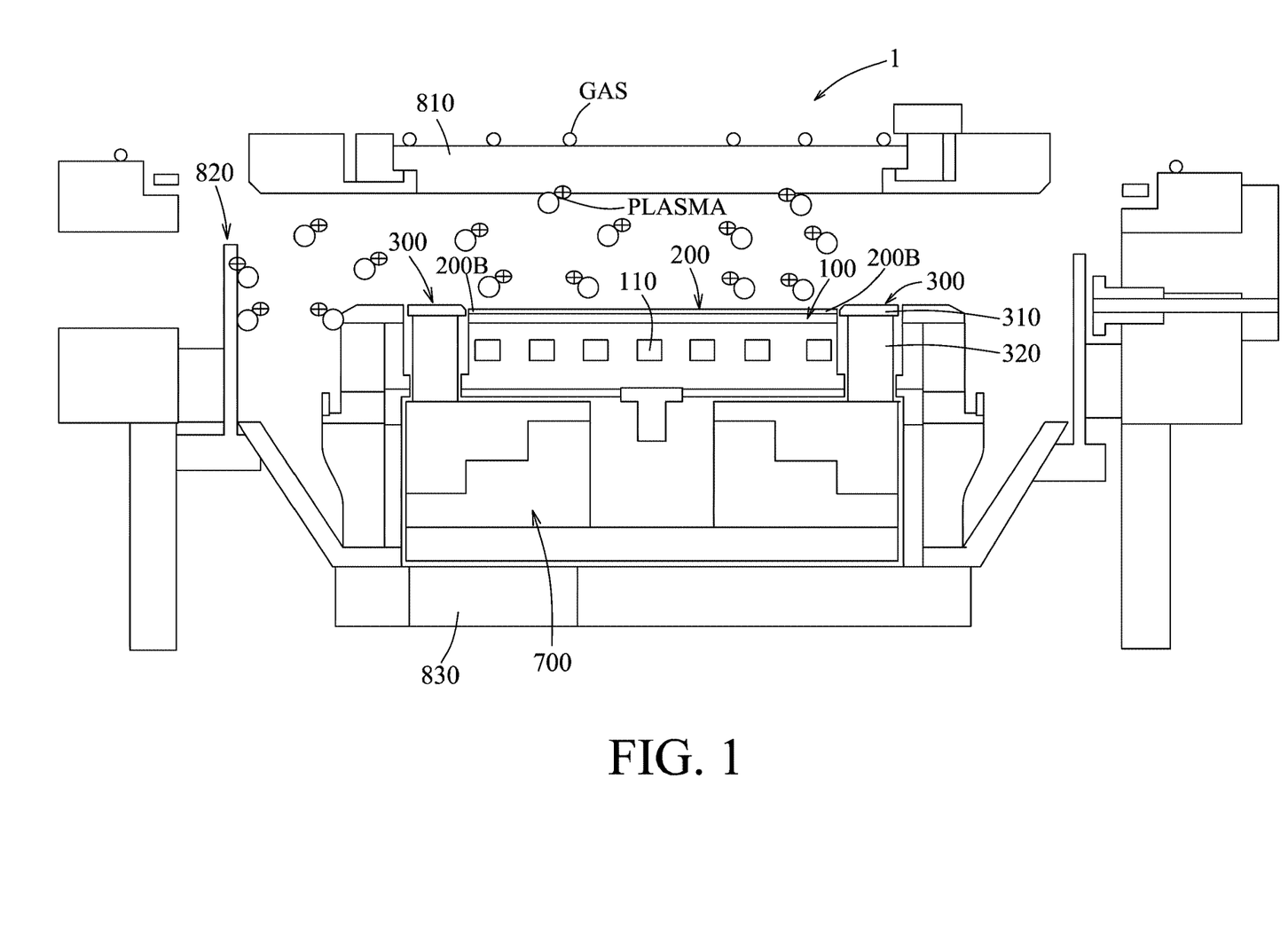
FIG. 1 is a schematic sectional view illustrating a device for treating a substrate in accordance with some embodiments.

FIG. 1 is a schematic sectional view illustrating a device 1 for treating a substrate 200 in accordance with some embodiments. In some embodiments, the device 1 is used for dry etching the substrate, and may be a plasma etching device, such as reactive-ion etcher, or inductively-coupled plasma reactive-ion etcher, but is not limited thereto. The device 1 includes a shower head 810 for converting an etching gas into plasma and for discharging the plasma into a processing chamber 820, a substrate retainer 100 disposed in the processing chamber 820 for retaining the substrate 200 thereon, a ring assembly 300 disposed to surround the substrate 200, and an exhaust unit 830 disposed downstream of the processing chamber 820 for reducing a pressure inside the processing chamber 820 at a predetermined level.

Figure 2:
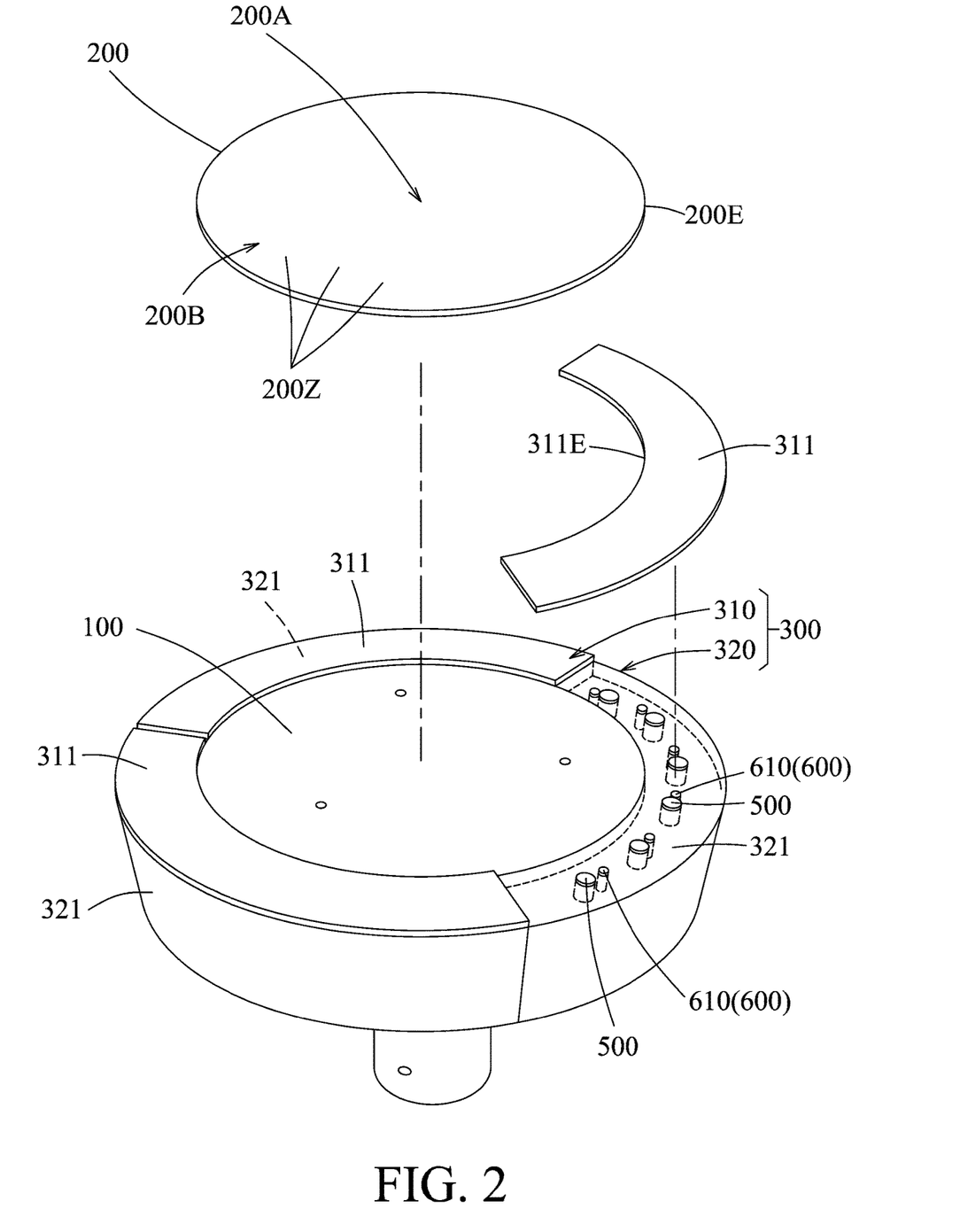
FIG. 2 is an exploded perspective view illustrating a ring assembly of the device and the substrate in accordance with some embodiments.

FIG. 2 is an exploded perspective view illustrating the ring assembly 300 and the substrate 200 in accordance with some embodiments. The ring assembly 300 has an inner peripheral configuration conforming to an outer periphery 200E of the substrate 200. For example, when the substrate 200 is a circular substrate (for example, a circular wafer), the ring assembly 300 is in a form of a circular ring; and when the substrate 200 is a rectangular substrate, the ring assembly 300 is in a form of a rectangular ring. The ring assembly 300 includes an upper ring 310 which has a plurality of upper ring segments 311 that are angularly displaced from each other.

Figure 3:
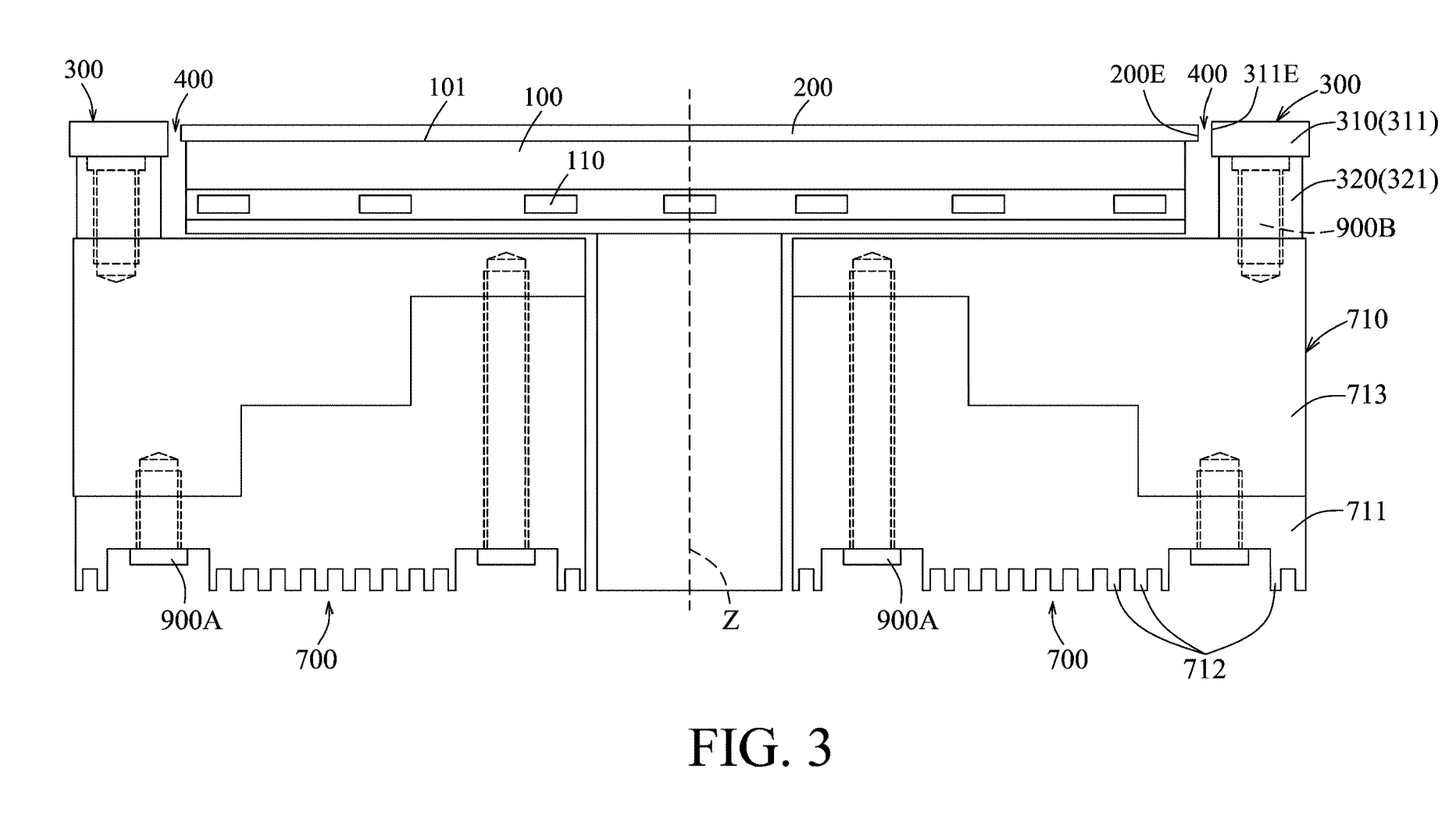
FIG. 3 is a fragmentary enlarged sectional view illustrating the device and the substrate in accordance with some embodiments.
Figure 4:
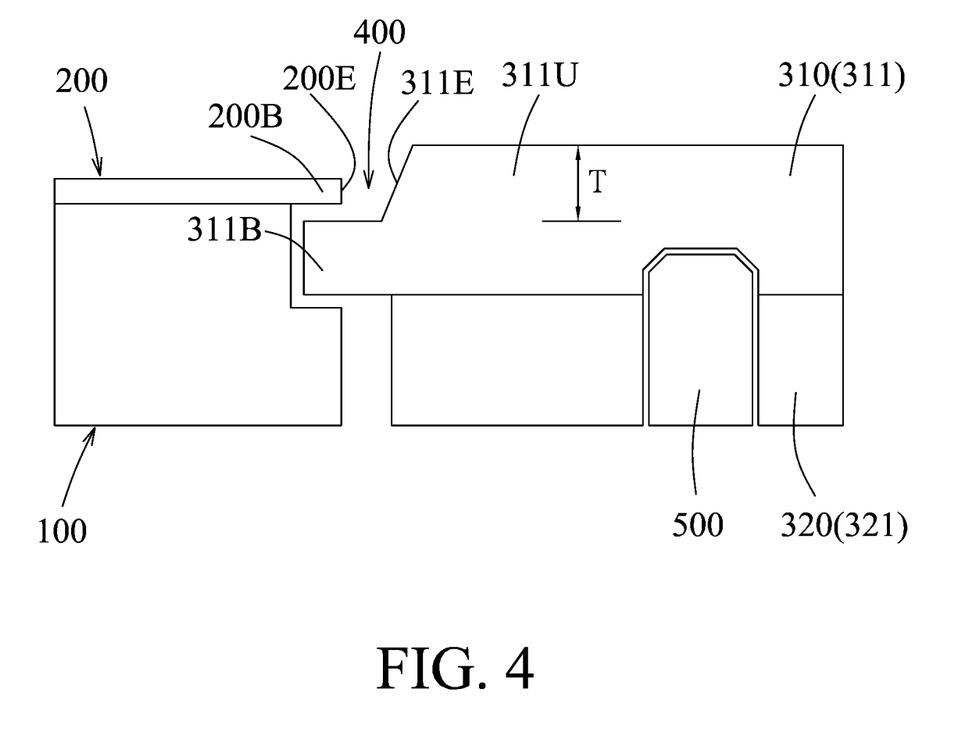
FIG. 4 is a fragmentary enlarged sectional view of the ring assembly and a peripheral region of the substrate in accordance with some embodiments.

FIG. 3 is a fragmentary enlarged sectional view of the device 1 and the substrate 200 in accordance with some embodiments. FIG. 4 is a fragmentary enlarged sectional view of the ring assembly 300 and a peripheral region 200B of the substrate 200 in accordance with some embodiments. Each of the upper ring segments 311 is movable between an inner position and an outer position so as to adjust a gap 400 between the outer periphery 200E of the substrate 200 and an inner edge 311E of each of the upper ring segments 311 when the substrate 200 is retained on the substrate retainer 100. At the inner position (see FIG. 9), each of the inner edges 311E of the upper ring segments 311 is proximate to a center of the substrate retainer 100. At the outer position (see FIG. 8), each of the inner edges 311E of the upper ring segments 311 is distal from the center of the substrate retainer 100.

Since the plasma is inputted into the processing chamber 820 from the shower head 810 and outputted from the exhaust unit 830, as shown in FIG. 1, the plasma in the processing chamber 820 may be unevenly distributed due to relative position of the shower head 810 and the exhaust unit 830, geometry of the processing chamber 820, or other possible factors, thereby affecting uniformity of process condition (e.g., plasma profile, plasma density, plasma etching rate) for the substrate 200, especially at the peripheral region 200B of the substrate 200. In some embodiments, as shown in FIG. 2, the substrate 200 has a main portion 200A and the peripheral region 200B disposed to surround the main portion 200A. In some embodiments, the peripheral region 200B of the substrate 200 may be referred to an ultra-edge region which has a width (extending inwardly from outer periphery 200E) of about 0% to about 2% of the substrate diameter. In some embodiments, the width of the ultra-edge region 200B is about 0 mm to about 6 mm. In general, several approaches, such as gas distribution control, gas ratio control, and temperature control of electrostatic chuck, are used to alleviate uneven distribution of plasma in the processing chamber 820. In some embodiments, the upper ring 310 is utilized to locally control process condition at the peripheral region 200B of the substrate 200 by moving the upper ring segments 311 to respectively adjust the gaps 400 (see FIG. 2) in order to achieve a uniform process condition.

When each of the upper ring segments 311 moves toward the inner position (or the outer position), a corresponding one of the gaps 400 will gradually become smaller (or larger), thereby controlling, for example, but not limited to, plasma profile at the peripheral region 200B of the substrate 200. The maximum movable distance of each of the upper ring segments 311 can be varied according to a space to receive the same. In some embodiments, a movable distance of each of the upper ring segments 311 ranges from about 0 mm to about 0.5 mm, but is not limited thereto.

Figure 8:
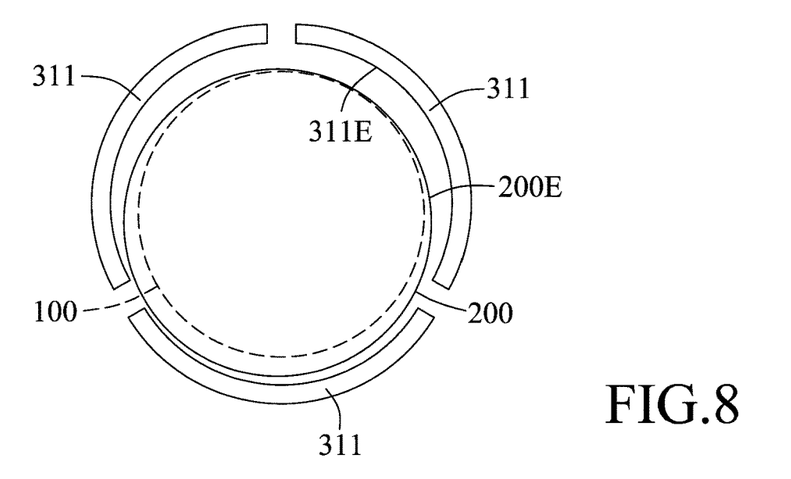
FIGS. 8 to 10 illustrate schematic top views of intermediate stages of the method depicted in FIG. 7 in accordance with some embodiments.

In some embodiments, a center of the substrate 200 may be offset from that of the substrate retainer 100 after being transported into the process chamber 820 and being placed on the substrate retainer 100 (see FIG. 8). The upper ring 310 can be used to reposition the substrate 200 on the substrate retainer 100 for centralization. For example, the substrate 200 is disposed on the substrate retainer 100 when the upper ring segments 310 are each in the outer position (see FIG. 8). Once the upper ring segments 311 are each moved to the inner position (see FIG. 9), the inner edges 311E of the upper ring segments 311 are permitted to be brought into contact with the outer periphery 200E of the substrate 200, thereby centrally positioning the substrate 200 on the substrate retainer 100. In some embodiments, the substrate retainer 100 includes an electrostatic chuck, but is not limited thereto. Other suitable substrate retainer 100 suitable for support or fixation of the substrate 200 are within the contemplated scope of the present disclosure.

In some embodiments, as shown in FIG. 2, the upper ring 310 may include three of the upper ring segments 311. In certain embodiments, the number of the upper ring segments 311 may be two or even more than three, which may vary according to the design for processing characteristics (e.g., uniformity) of the device 1.

Moreover, in some embodiments, process condition (e.g., plasma etching rate) at the peripheral region 200B of the substrate 200 may be affected by cross-sectional geometry design of the upper ring segments 311 or on the basis of thermal properties (e.g., thermal conductivity, X) of materials of the upper ring segments 311. Referring to FIG. 4, in some embodiments, each of the upper ring segments 311 has an upper part 311U and a lower part 311B which is beneath the upper part 311U and which is to be located beneath a bottom of the peripheral region 200B of the substrate 200 when the substrate 200 is disposed on the substrate retainer 100. In some embodiments, the upper part 311U has a thickness (T) ranging from about 1 mm to about 50 mm, but is not limited thereto. In some embodiments, each of the upper ring segments 311 independently includes silver, aluminum, silicon, iron, aluminum oxide, or combinations thereof. In certain embodiments, a carrier gas, such as helium, argon, nitrogen, other suitable inert gases, or the like, for generating plasma may pass through the gaps 400. Therefore, plasma etching rate at the peripheral region 200B of the substrate 200 may also be controlled by flow rate or thermal property of the carrier gas.

Referring to FIGS. 1 and 2, in some embodiments, the ring assembly 300 further includes a lower ring 320 which includes a plurality of the lower ring segments 321 that are respectively mounted beneath the upper ring segments 311 so as to permit the upper ring segments 311 to move respectively with the lower ring segments 321. In some embodiments, the upper ring segment 311 may be mounted to the lower ring segment 321 using an adhesive, but is not limited thereto. Other manner suitable for mounting the upper ring segment 311 to the lower ring segment 321 are within the contemplated scope of the present disclosure. The number of the lower ring segments 321 is equal to that of the upper ring segments 311. In some embodiments, the lower ring 320 includes three of the lower ring segments 321, but is not limited thereto. In certain embodiments, the number of the lower ring segments 321 may vary according to the number of the upper ring segments 311.

Referring to FIG. 2, in some embodiments, the device 1 further includes a plurality of first heating elements 500 which are provided for controlling temperature of the peripheral region 200B of the substrate 200 during a treatment (for example, but not limited to, a plasma processing). The first heating elements 500 are disposed between the upper ring 310 and the lower ring 320, and are angularly displaced from each other. In some embodiments, in order to obtain a uniform temperature distribution of the upper ring 310, at least one of the first heating elements 500 is disposed between each of the upper ring segments 311 and a corresponding one of the lower segments 321. In addition, a temperature of each of the upper ring segments 311 can be independently and finely controlled by a corresponding one of the first heating elements 500. In some embodiments, in order to achieve a uniform temperature distribution of the upper ring segment 311, each of the upper ring segments 311 is heated by a plurality of the first heating elements 500, and thus each of the upper ring segments 311 includes a plurality of heating areas 311A (see FIG. 11) displaced from each other. Each of the heating areas 311A is heated by a corresponding one of the first heating elements 500. In some embodiments, each of the upper ring segments 311 may be heated by six of the first heating elements 500, but is not limited thereto. The number of the first heating elements 500 disposed between each of the upper ring segments 311 and a corresponding one of the lower segments 321 may vary independently (e.g., greater than one and less than six, or greater than six) according to the design for processing characteristics (e.g., uniformity) of the device 1. In some embodiments, any two adjacent ones of the first heating elements 500 is equal-angularly displaced from each other, but is not limited thereto. Any two adjacent ones of the first heating elements 500 may have angular arrangements that are different from each other according to the design for processing characteristics (e.g., uniformity) of the device 1.

Referring to FIG. 4, in some embodiments, each of the first heating elements 500 has a lower portion which is embedded in a corresponding one of the lower ring segments 321, and an upper portion which protrudes from an upper surface of the corresponding lower ring segment 321 and which extends into a recess formed at a lower surface of the corresponding upper ring segment 311. In some other embodiments, an upper portion of each of the first heating elements 500 is flush with an upper surface of the corresponding lower ring segment 321 and is in contact with the lower surface of the corresponding upper ring segment 311. Thus, the upper ring segments 311, which are respectively heated by the first heating elements 500, can serve as a heat source for the peripheral region 200B of the substrate 200. In some embodiments, the upper ring 310 can be referred to as a focus ring, and the lower ring 320 where the first heating elements 500 are embedded can be referred to as a heater ring. In some embodiments, the lower ring 320 includes an insulating material, such as ceramics like aluminum oxide ($Al_2O_3$) or yttrium oxide ($Y_2O_3$), so the lower ring 320 can be referred to as an insulator ring, as well. In some embodiments, as shown in FIG. 1, the device 1 further includes a plurality of second heating elements 110 disposed in the substrate retainer 100 which are provided for controlling temperature of the substrate 200 at the main region 200A.

Figure 5:
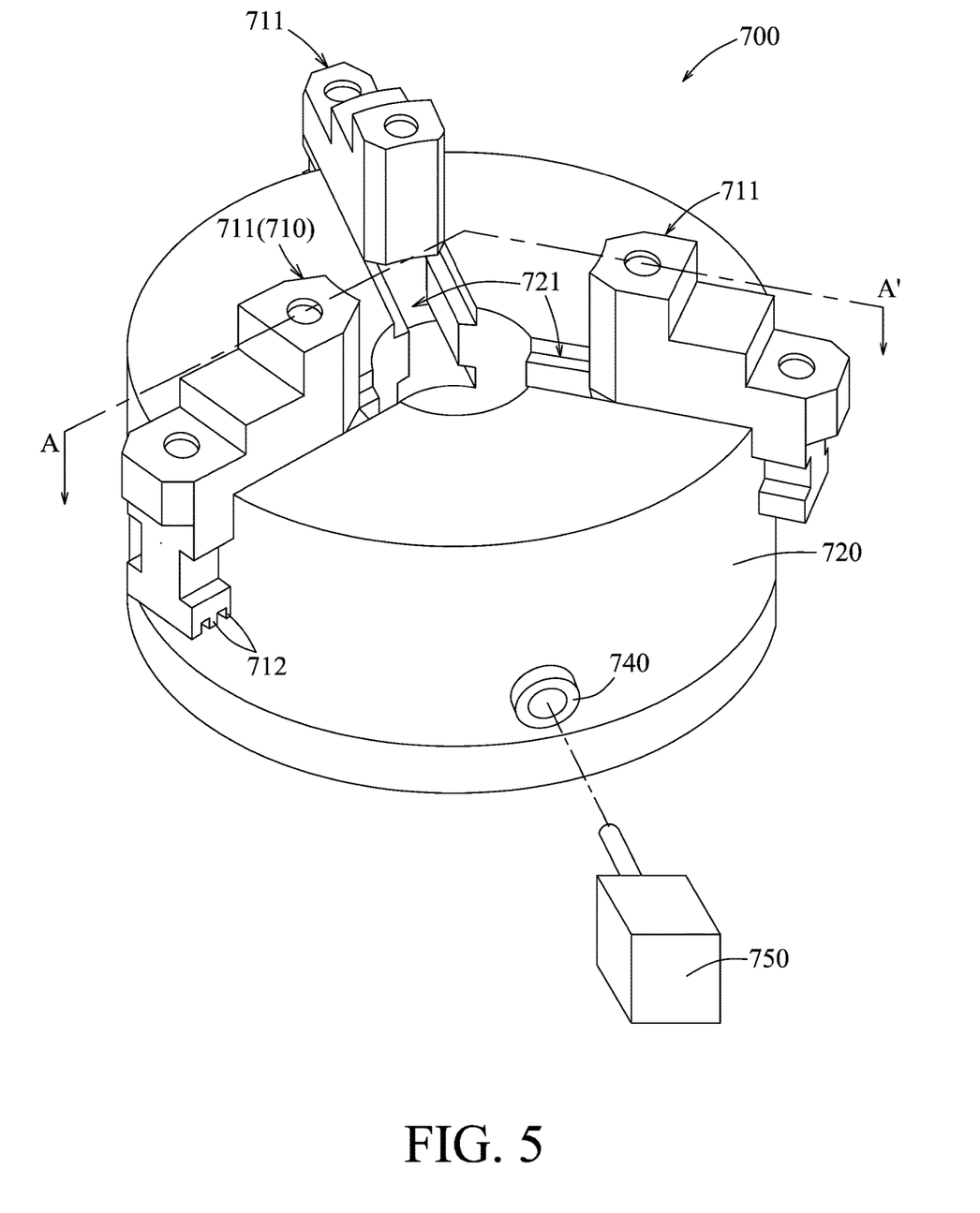
FIG. 5 is a perspective view of a jaw assembly of the device in accordance with some embodiments.

In some embodiments, the device 1 further includes a jaw assembly 700 which is located beneath the ring assembly 300, as shown in FIGS. 1 and 3. FIG. 5 is a perspective view of the jaw assembly 700 in accordance with some embodiments. The jaw assembly 700 is provided to enable movement of the upper ring segments 311, and includes a plurality of jaw chucks 710. The jaw chucks 710 shown in FIG. 3 are illustrated along line A-A' of FIG. 5.

Referring to FIGS. 3 and 5, in some embodiments, the jaw chucks 710 are respectively coupled to the upper ring segments 311 and are radially movable between an inward position, where the upper ring segments 311 are each in the inner position (see FIG. 9), and an outward position, where the upper ring segments 311 are each in the outer position (see FIG. 8). That is, the number of the jaw chucks 710 is required to be equal to that of the upper ring segments 311. In some embodiments, as shown in FIG. 5, the jaw assembly 700 includes three of the jaw chucks 710, but is not limited thereto. In some embodiments, the number of the jaw chucks 710 may vary according to the number of the upper ring segments 311.

Referring to FIG. 3, in some embodiments, each of the jaw chucks 710 is coupled to a corresponding one of the upper ring segments 311 by a corresponding one of the lower ring segments 321. Each of the jaw chucks 710 includes a main body 711 and an auxiliary body 713 which is disposed between the main body 711 and a corresponding one of the lower ring segments 321, and which is disposed to couple the main body 711 with the corresponding lower ring segment 321. In some embodiments, for each of the jaw chucks 710, the main body 711 may be secured to the auxiliary body 713 using at least one fastener 900A which extends through the main body 711 to be threaded into a mounting hole (not shown) of the auxiliary body 713. Each of the lower ring segments 321 may be secured to the auxiliary body 713 of a corresponding one of the jaw chucks 710 using at least one fastener 900B which extends through the corresponding lower ring segment 321 to be threaded into another mounting hole (not shown) of the auxiliary part 713 of the corresponding jaw chuck 710. Thus, movement of each of the main bodies 711 can drive the movement of a corresponding one of the upper ring segments 311. In some embodiments, the fasteners 900A, 900B may each includes screws, bolt/nut combinations, cotter pins, rivets, or any other suitable fastening mechanisms. For each of the jaw chucks 710, other coupling manner suitable for attaching the auxiliary body 713 to the main body 711 or attaching the auxiliary body 713 to the corresponding lower ring segment 321 are within the contemplated scope of the present disclosure.

Figure 6:
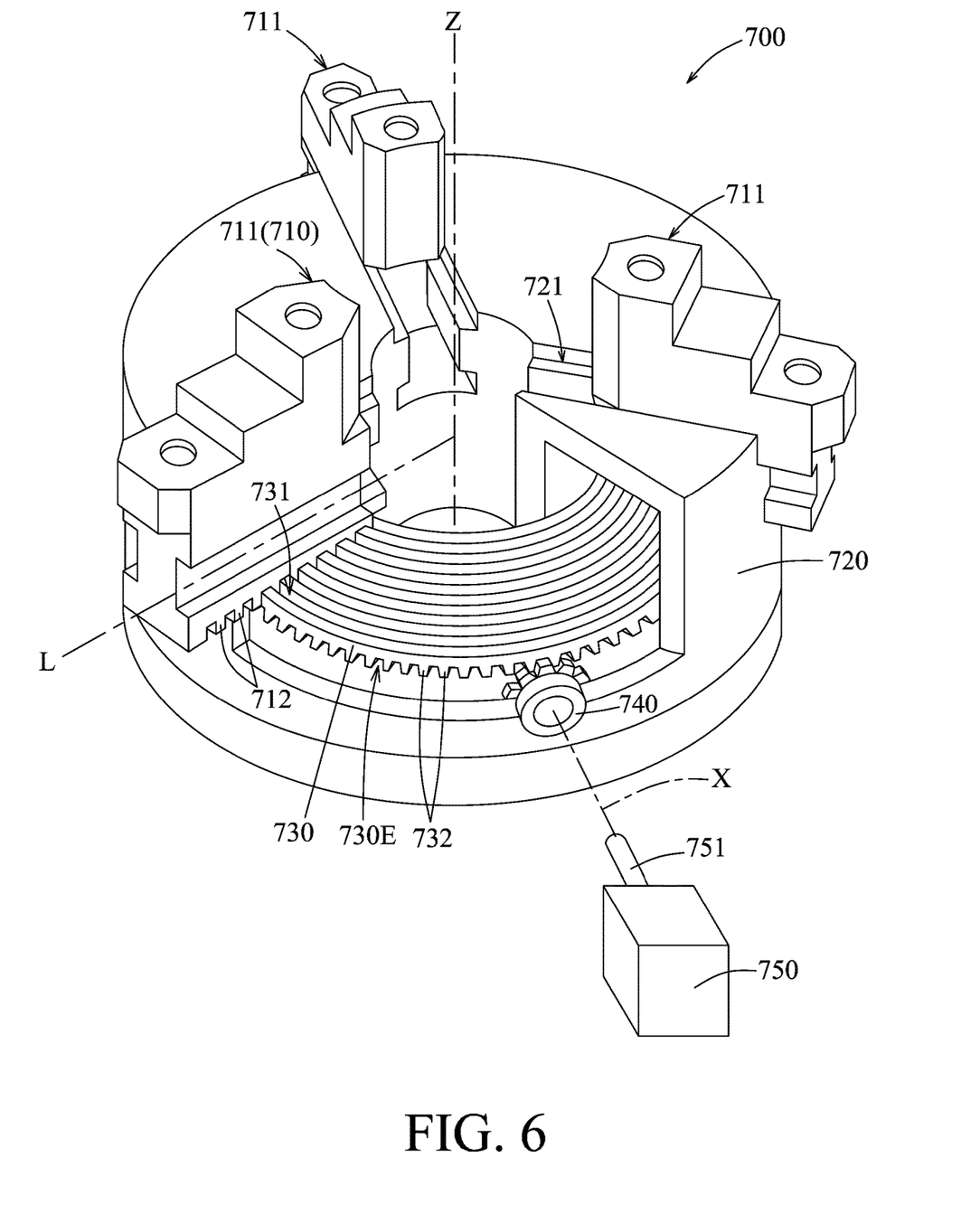
FIG. 6 is a view similar to that of FIG. 5 but with a portion of a chuck retainer being cut away to show elements inside the chuck retainer in accordance with some embodiments.

In some embodiments, the jaw assembly 700 may further include a chuck retainer 720, and a guiding wheel 730. FIG. 6 is a view similar to that of FIG. 5 but with a portion of the chuck retainer 720 being cut away to show elements inside the chuck retainer 720 in accordance with some embodiments. Referring to FIGS. 5 and 6, in some embodiments, the chuck retainer 720 has a plurality of guiding slots 721, respectively, for slidably receiving the jaw chucks 710 therein so as to permit the jaw chucks 710 to be radially slidable relative to the chuck retainer 720.

Referring to FIG. 6, in some embodiments, the guiding wheel 730 is disposed beneath and is coupled to the jaw chucks 710 so as to permit rotation of the guiding wheel 730 to be translated into synchronous and radial movement of the jaw chucks 710 between the inward and outward positions. In some embodiments, the guiding wheel 730 has an upper surface and a lower surface which are respectively proximate to and distal from the substrate retainer 100 (see FIG. 3). The upper surface of the guiding wheel 730 is formed with a spiral groove 731. The main body 711 of each of the jaw chucks 710 has a plurality of guided teeth 712 engaging the spiral groove 731 so as to permit the jaw chucks 710 to move synchronously and radially in response to rotation of the guiding wheel 730. In certain embodiments, the guiding wheel 730 is driven to rotate about a rotational axis (Z) normal to a major surface 101 of the substrate retainer 100 (see FIGS. 3 and 6). In some embodiments, the guided teeth 712 of the main body 711 are displaced from each other in a radial line (L) intersecting the rotational axis (Z).

Referring to FIG. 6, in some embodiments, the jaw assembly 700 may further include a plurality of bevel gear teeth 732, a drive gear 740, and a drive motor 750. The bevel gear teeth 732 are formed on an outer periphery 730E of the lower surface of the guiding wheel 730, and are angularly displaced from each other. The drive gear 740 is configured to mesh with the bevel gear teeth 732 so as to drive the guiding wheel 730 to rotate with the drive gear 740. The drive motor 750 is coupled to drive rotation of the drive gear 740. In certain embodiments, the drive motor 750 has an output shaft 751 configured to rotate about an axis (X) transverse to the rotational axis (Z) for outputting a rotational force, and the drive gear 740 is mounted on the output shaft 751 to rotate therewith. In some embodiments, the axis (X) is orientated parallel to the major surface 101 of the substrate retainer 100 (see FIG. 3). In some embodiments, the drive motor 750 includes a step motor, but is not limited thereto. Other drive motors suitable for driving movement of the jaw chucks 710 are within the contemplated scope of the present disclosure.

Figure 7:
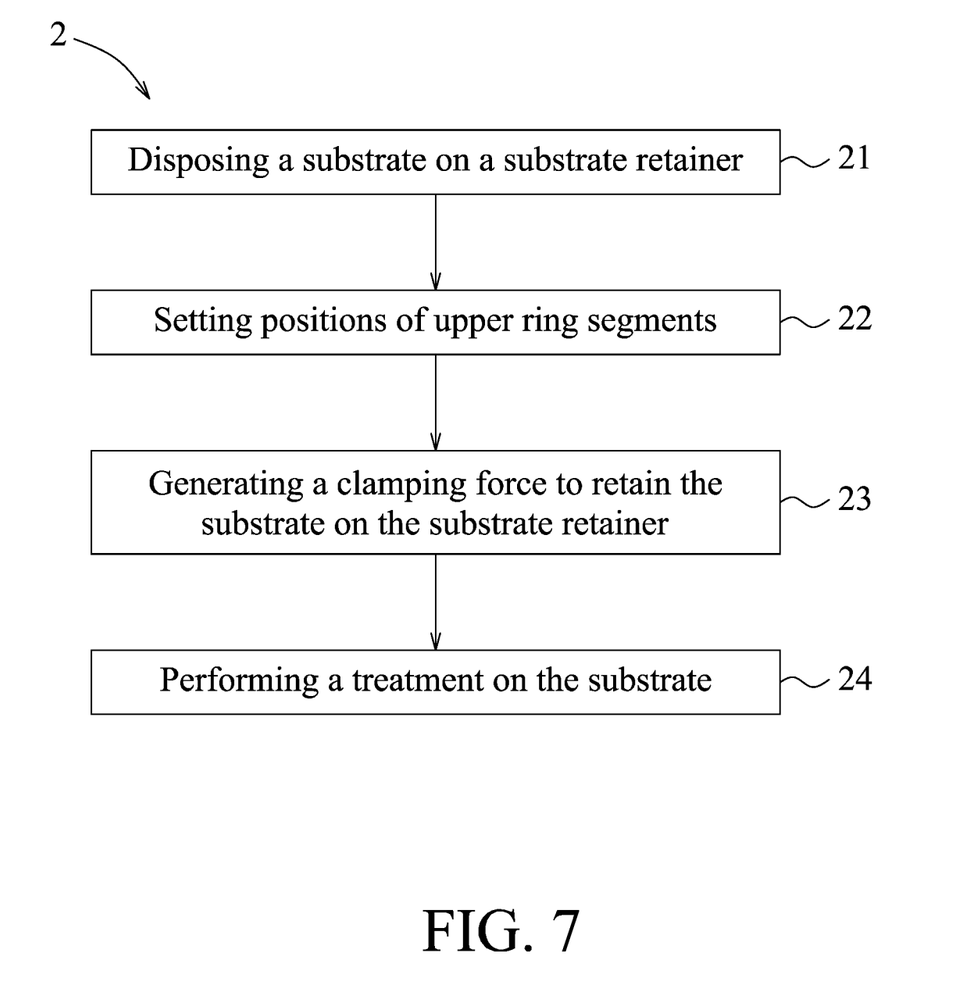
FIG. 7 is a flow diagram illustrating a method for treating a substrate using the device in accordance with some embodiments.
Figure 9:
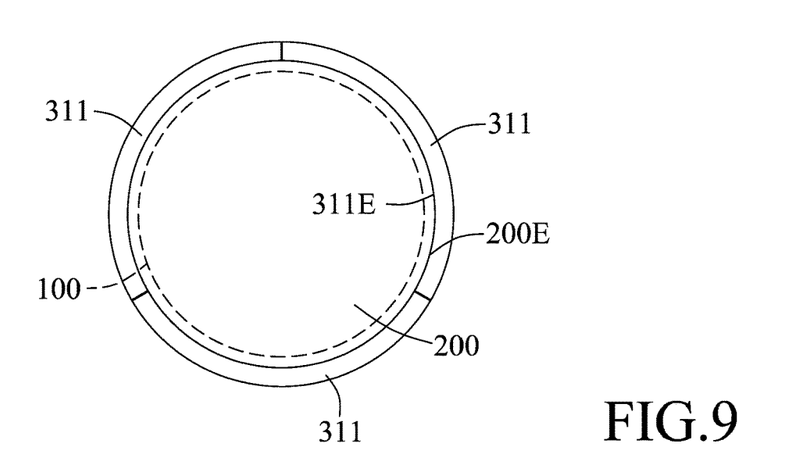
Figure 10:
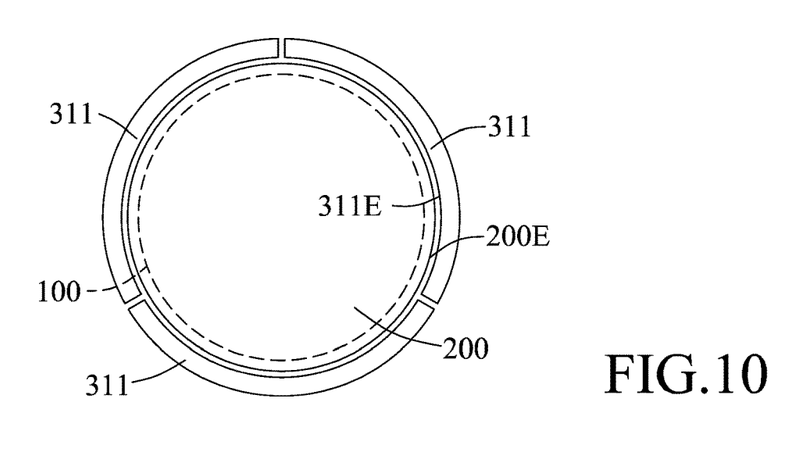

FIG. 7 is a flow diagram illustrating a method 2 for treating the substrate 200 using the device 1 in accordance with some embodiments. The substrate 200 may include a plurality of semiconductor devices (for example, but not limited to, transistors or memories) disposed thereon. FIGS. 8 to 10 illustrate schematic views of the intermediate stages of the method 2 in accordance with some embodiments. For purposes of simplicity and clarity, some elements, for example, elements of the jaw assembly 700, are omitted in FIGS. 8 to 10. Similar numerals from the above-mentioned embodiments are used where appropriate.

Referring to FIGS. 7 and 8, the method 2 begins at step 21, where the substrate 200 is disposed on the substrate retainer 100. In some embodiments, a center of the substrate 200 may be offset from that of the substrate retainer 100.

Referring to FIGS. 7 and 10, the method 2 proceeds to step 22, where positions of the upper segments 311 are set to permit the inner edge 311E of each of the upper ring segments 311 to be spaced apart from the outer periphery 200E of the substrate 200 by a predetermined distance. In some embodiments, the movement of the upper segments 311 are driven by the jaw assembly 700 (see FIG. 3). In some embodiments, step 22 of setting the positions of the upper ring segments 311 includes substeps 22A and 22B.

Referring to FIG. 9, in substep 22A, the upper ring segments 311 is moved from the outer position (see FIG. 8) to the inner position (see FIG. 9), so as to permit the inner edges 311E of the upper ring segments 311 to be brought into contact with the outer periphery 200E of the substrate 200, thereby centrally positioning the substrate 200 on the substrate retainer 100.

Referring to FIG. 10, in substep 22B, the upper ring segments 311 are moved after the substrate 200 is centrally positioned such that the inner edge 311E of each of the upper ring segments 311 is spaced apart from the outer periphery 200E of the substrate 200 by the predetermined distance. In some embodiments, substep 22B is performed by moving the upper ring segments 311 from the inner position toward the outer position until the inner edge 311E of each of the upper ring segments 311 is spaced apart from the outer periphery 200E of the substrate 200 by the predetermined distance. In some other embodiments, substep 22B is performed by moving the upper ring segments 311 from the inner position to the outer position, and then moving the upper ring segments 311 from the outer position toward the inner position until the inner edge 311E of each of the upper ring segments 311 is spaced apart from the outer periphery 200E of the substrate 200 by the predetermined distance.

Referring to FIG. 7, the method 2 proceeds to step 23, where a clamping force is generated to retain the substrate 200 on the substrate retainer 100. In some embodiments, when the substrate retainer 100 is an electrostatic chuck, the clamping force is an electrostatic force. Other clamping mechanism suitable for clamping the substrate 200 are within the contemplated scope of the present disclosure.

Referring to FIG. 7, the method 2 proceeds to step 24, where a treatment is performed on the substrate 200 after setting the positions of the upper ring segments 311. In some embodiments, the treatment is performed by an etching process (e.g., a plasma etching), but is not limited thereto. Other treatments suitable for treating the substrate 200 are within the contemplated scope of the present disclosure.

In some embodiments, some steps in the method 2 may be modified, replaced, or eliminated without departure from the spirit and scope of the present disclosure. In some alternative embodiments, other suitable methods may also be applied for forming the semiconductor device.

Figure 11:
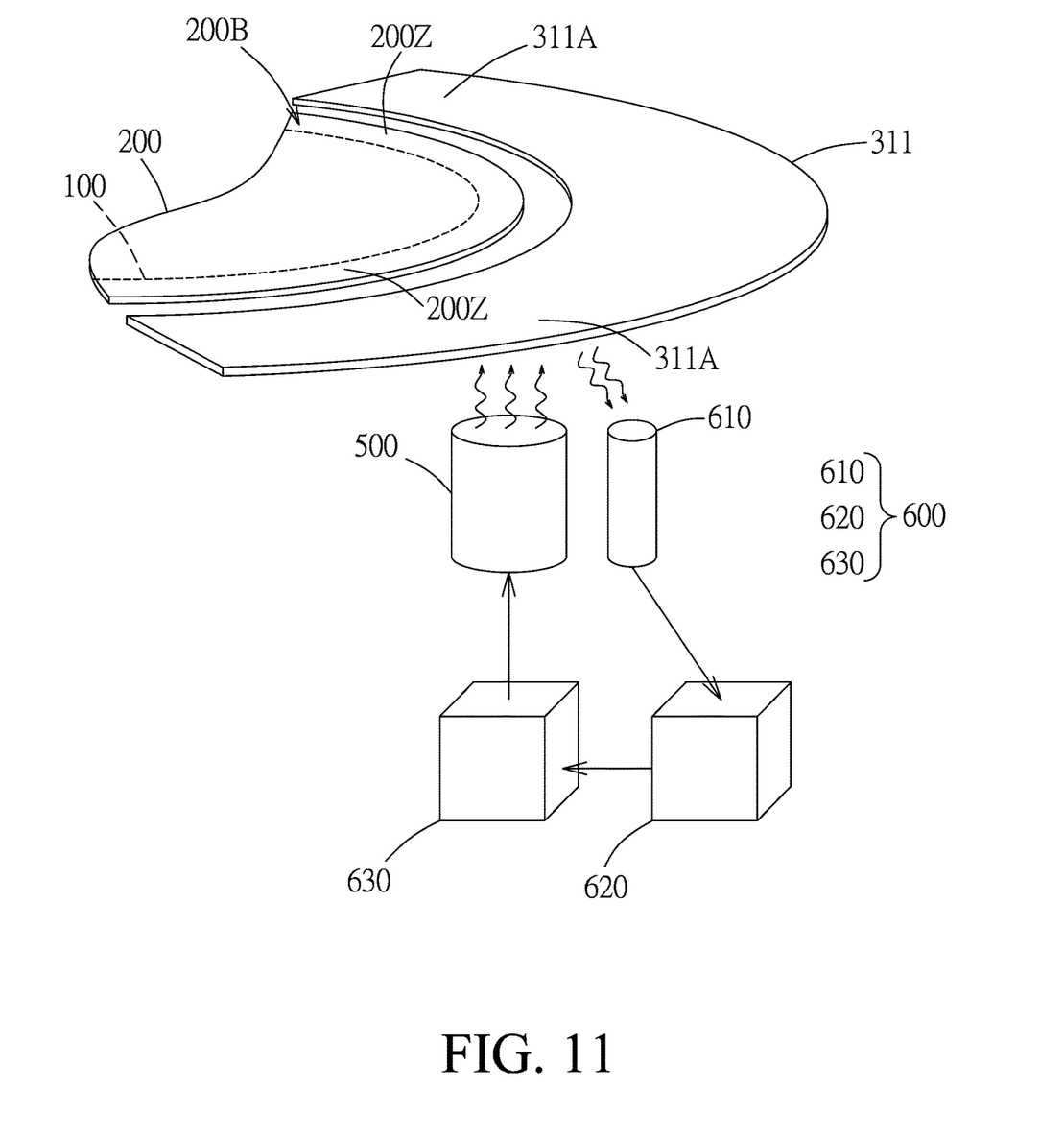
FIG. 11 is a fragmentary perspective schematic view illustrating a control unit of the device in accordance with some embodiments.

In some embodiments, the device 1 further includes a control unit 600 which is provided for controlling a temperature distribution in the upper ring 310, as shown in FIG. 2. FIG. 11 is a fragmentary perspective schematic view illustrating the control unit 600 in accordance with some embodiments. Since the upper ring 310 serves as a heat source for the peripheral region 200B of the substrate 200, the temperature distribution of the upper ring 310 directly affects a temperature distribution of the peripheral region 200B of the substrate 200, thereby affecting the etching rate of the peripheral region 200B. Therefore, the temperature distribution of the upper ring 310 is one of the important parameters to be detected for controlling etching rate at the peripheral region 200B of the substrate 200.

Referring to FIGS. 2 and 11, in some embodiments, the control unit 600 includes a plurality of temperature sensors 610, a data collector 620, and a controller 630. The temperature sensors 610 are provided for measuring a temperature distribution of the upper ring 310. The temperature sensors 610 are disposed between the upper ring 310 and the lower ring 320, and are angularly displaced from each other. Each of the temperature sensors 610 is disposed for detecting a temperature around a corresponding one of the first heating elements 500 (i.e., a temperature at a corresponding one of the heating areas 311A of the upper ring segments 311). That is, the number of the temperature sensors 610 may be equal to that of the first heating elements 500. In some embodiments, the temperature sensors 610 are located in proximity to the first heating elements 500, respectively. Therefore, a temperature of each of the heating areas 311A can be respectively detected and measured by a corresponding one of the temperature sensors 610. In some embodiments, each of the temperature sensors 610 may have a p-n junction which can convert light photons or electromagnetic radiation into electrical signals (e.g., current, voltage, or resistance). Thus, a temperature of each of the heating areas 311A can be read out according to intensity of light photons or electromagnetic radiation emitted therefrom. In some embodiments, each of the temperature sensors 610 includes a photo sensor, or a bolometer. Other suitable sensors for detecting a temperature distribution of the upper ring 310 are within the contemplated scope of the present disclosure.

Referring to FIG. 11, in some embodiments, the data collector 620 is in signal communication with the temperature sensors 610 (one of which is shown in FIG. 11) so as to collect temperature signals from the temperature sensors 610. In some embodiments, the controller 630 is in signal communication with the data collector 620 and the first heating elements 500 so as to control operation of each of the first heating elements 500 based on a corresponding one of the temperature signals from the temperature sensors 610.

Figure 12:
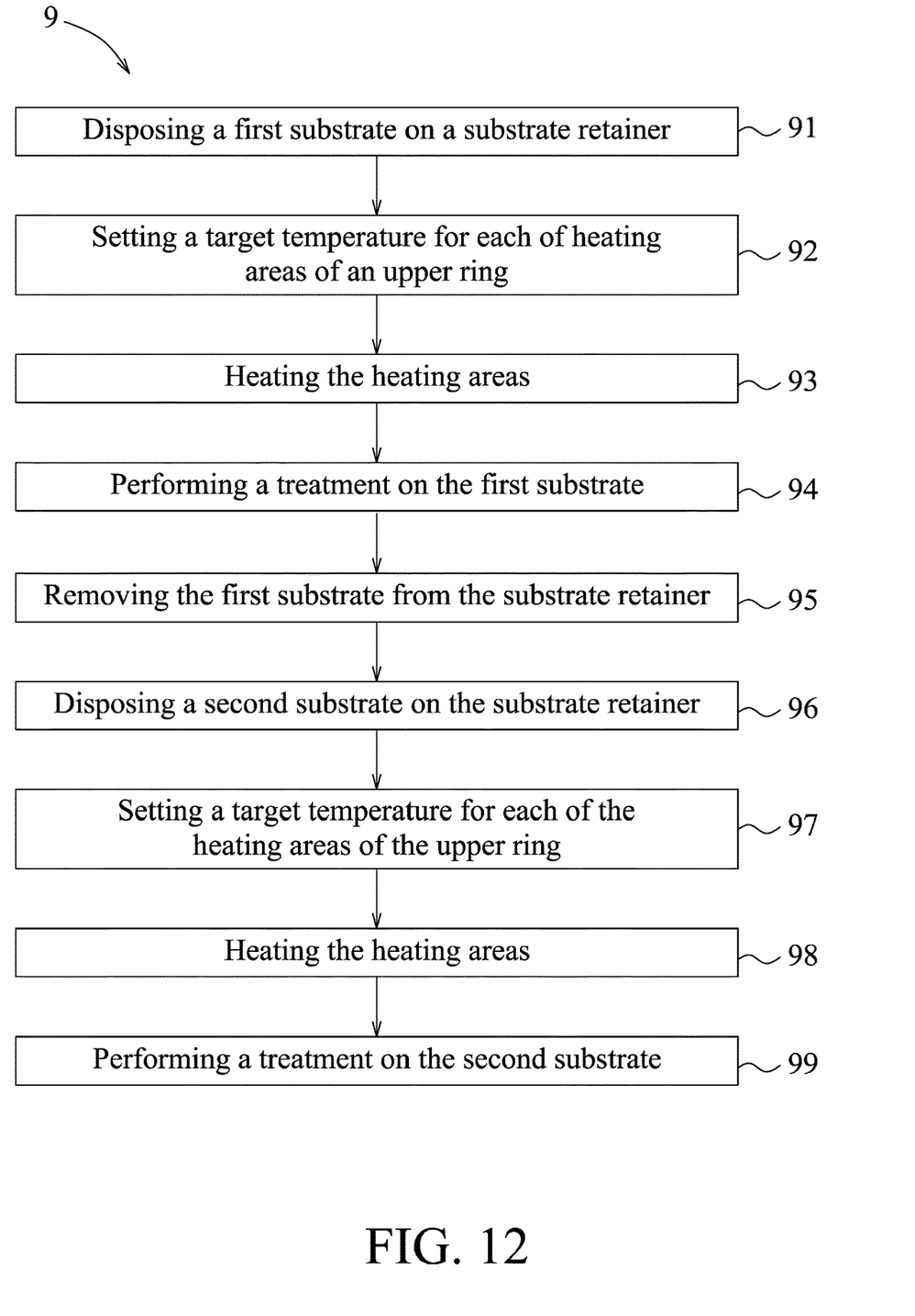
FIG. 12 is a flow diagram illustrating another method for treating a substrate using the device in accordance with some embodiments.

FIG. 12 is a flow diagram illustrating a method 9 for treating a first substrate (for example, the substrate 200) using the device 1 in accordance with some embodiments. The first substrate 200 may include a plurality of semiconductor devices (for example, but not limited to, transistors or memories) disposed thereon. In some embodiments, the method 9 includes steps 91 to 95.

Referring to FIGS. 11 and 12, the method 9 begins at step 91, where the first substrate 200 is disposed on the substrate retainer 100.

Referring to FIGS. 11 and 12, the method 9 proceeds to step 92, where a target temperature for each of the heating areas 311A of the upper ring segments 311 of the upper ring 310 is set according to a recipe for a treatment to be performed on the first substrate 200. The upper ring 310 is disposed to surround the peripheral region 200B of the first substrate 200, and the heating areas 311A are angularly displaced from each other. In some embodiments, as shown in FIG. 2, the upper ring segments 311 are separately formed, whereas in some non-shown embodiments, the upper ring segments 311 may be integrally formed.

Referring to FIGS. 11 and 12, the method 9 proceeds to step 93, where the heating areas 311A are heated using the first heating elements 500 (one of which is shown in FIG. 11) which are disposed in positions respectively corresponding to the heating areas 311A so as to keep each of the heating areas 311A at the target temperature, thereby heating the peripheral region 200B of the first substrate 200 through thermal conduction between the upper ring 310 and the first substrate 200 (see FIGS. 2 and 4). In some embodiments, the first heating elements 500 are disposed beneath the heating areas 311A, respectively.

In some embodiments, step 93 of heating each of the heating areas 311A includes steps 93A and 93B performed after the first heating elements 500 start heating the upper ring 310.

In substep 93A, a temperature at each of detecting positions corresponding respectively to the heating areas 311A is detected by a corresponding one of the temperature sensors 610. The temperature at each of the detecting positions aims to reflect a real-time temperature of a corresponding one of the heating areas 311A of the upper ring segments 311 of the upper ring 310. To be specific, a real-time temperature of each of the heating areas 311A is measured by a corresponding one of the temperature sensors 610. Then, the temperature signals from the temperature sensors 610 for reflecting real-time temperature of the heating areas 311A are transmitted to the data collector 620. Afterwards, the data collector 620 processes the temperature signals to determine whether the real-time temperature of each of the heating areas 311A is equal to the target temperature set in the recipe.

In substep 93B, operations of each of the first heating elements 500 are determined by the controller 630 based on the temperature detected at a corresponding one of the detecting positions. For example, when the real-time temperature of one of the heating areas 311A is determined to be lower than the target temperature, the controller 630 gives a positive command to the corresponding first heating element 500 (e.g., increasing electric current flowing through a resistance material in the corresponding first heating element 500), so that the corresponding heating element 500 increases a temperature of the one of the heating area 311A. On the other hand, when the real-time temperature of one of the heating areas 311A is determined to be higher than the target temperature, the controller 630 gives a negative command to the corresponding first heating element 500 (e.g., decreasing electric current flowing through a resistance material in the corresponding first heating element 500), so that the corresponding first heating element 500 stop the increase in a temperature of the one of the heating area 311A. In some embodiments, substeps 93A and 93B are executed repeatedly until the real-time temperature of each of the heating areas 311A is equal to the target temperature set in the recipe.

In order to enhance critical dimension uniformity (CDU) at the peripheral region 200B of the substrate 200, an etching rate at the peripheral region 200B of the substrate 200 can be further adjusted by a temperature control to alleviate a pre-stage effect or compensate uneven distribution of plasma in the processing chamber 820. Hence, in some embodiments, a target temperature of each of the heating areas 311A of the upper ring segments 311 can be finely tuned in further consideration of a critical dimension (CD) of a corresponding one of peripheral zones 200Z at the peripheral region 200B of the substrate 200. Thus, each of the peripheral zones 200Z of the substrate 200 can be heated under different temperature through thermal conductance by adjusting a corresponding one of the heating areas 311A which is proximate thereto.

The critical dimension (CD) is a size or width of a pattern (e.g., a polysilicon line, a metal line, a trench, a contact, or the like) of the substrate 200. In some embodiments, the plasma processing for treating the substrate 200 may be a plasma etching process, which may be performed after the substrate 200 is subjected to a lithography process. In this case, the substrate 200 includes a patterned mask layer (e.g., photoresist, hard mask layer, or the like) formed on a semiconductor structure after a lithography process, and then a pattern of the patterned mask layer is transferred to the semiconductor structure by the plasma etching process. Hence, the CD of the patterned mask layer will significantly influence the CD of the patterned semiconductor structure after the plasma etching process (i.e., the pre-stage effect). The CD of the patterned mask layer is evaluated as an after-develop inspection (ADI) CD, which is a measurement value measured at a stage of after-develop inspection (i.e., after a lithography process), and the CD of the patterned semiconductor structure is evaluated as an after-etch inspection (AEI) CD, which is a measurement value measured at a stage of after-etch inspection (i.e., after an etching process). The ADI CD of the patterned mask layer and the AEI CD of the patterned semiconductor structure respectively have an ADI measurement target and an AEI measurement target to be met.

In some embodiments, the method 9 may further include steps 92A and 92B for pre-stage effect alleviation.

In step 92A, a critical dimension of each of the peripheral zones 200Z at the peripheral region 200B of the first substrate 200 is detected. The peripheral zones 200Z are angularly displaced from each other. In some embodiments, step 92A is performed before step 91, and the critical dimension may be an ADI CD of a patterned mask layer (not shown) at each of the peripheral zones 200Z at the peripheral region 200B of the first substrate 200. To be specific, first, each of the peripheral zones 200Z at the peripheral region 200B of the first substrate 200 has an ADI CD measurement data measured after a lithography process. Then, the ADI CD measurement data of each of the peripheral zones 200Z of the first substrate 200 is transmitted to the data collector 620. Afterwards, the data collector 620 processes the ADI CD measurement data to determine whether the ADI CD of each of the peripheral zones 200Z is equal to the ADI measurement target.

Step 92B is performed after step 92 and before step 93. In step 92B, whether or not the target temperature for each of the heating areas 311A of the upper ring segments 311 of the upper ring 310 is required to be tuned is determined by the controller 630 based on the critical dimension detected at a corresponding one of the peripheral zones 200Z at the peripheral region 200B of the first substrate 200. In the case that a defected pattern of the patterned mask layer is a contact hole feature, when the ADI CD measurement data of one of the peripheral zones 200Z is determined to be less than the ADI measurement target, the target temperature of a corresponding one of the heating areas 311A of the upper ring segments 311 is tuned to be higher than a predetermined value of the target temperature set in the recipe in step 92, so as to permit the one of the peripheral zones 200Z to be etched at a higher etching rate. On the other hand, when the ADI CD measurement data of one of the peripheral zones 200Z is determined to be larger than the ADI measurement target, a target temperature of a corresponding one of the heating areas 311A of the upper ring segments 311 is tuned to be less than the predetermined value of the target temperature set in the recipe in step 92, so as to permit the one of the peripheral zones 200Z to be etched at a lower etching rate.

After the target temperature for each of the heating areas 311A is determined (the target temperature may be tuned or not tuned in step 92B), the heating areas 311A are heated by the first heating elements 500 in step 93, and substeps 93A and 93B are executed repeatedly until the real-time temperature of each of the heating areas 311A is equal to the target temperature determined in step 92B.

Referring to FIG. 12, the method 9 proceeds to step 94, where the treatment is performed on the first substrate 200 after the real-time temperature of each of the heating areas 311A is equal to the target temperature set in step 92 or determined in step 92B. In some embodiments, the treatment is performed by dry etching, but is not limited thereto. Other treatments suitable for treating the first substrate 200 are within the contemplated scope of the present disclosure.

Referring to FIG. 12, the method 9 proceeds to step 95, where the first substrate 200 is removed from the substrate retainer 100.

In some embodiments, referring to FIG. 12, the method 9 may further include steps 96 to 99 for treating a second substrate (which has a configuration the same as that of the first substrate 200 and thus is also denoted by the numeral 200). Steps 96 to 99 for treating the second substrate 200 are substantially the same as steps 91 to 94 for the first substrate 200, and thus the details thereof are omitted for the sake of brevity.

In some embodiments, the method 9 may further include steps 97A and 97B for compensating uneven distribution of plasma in the processing chamber 820 for a plasma etching process.

In step 97A, a critical dimension of each of the peripheral zones 200Z at the peripheral region 200B of the first substrate 200 which is obtained in step 94 is detected. In some embodiments, step 97A is performed before step 98 and after step 95, and the detected critical dimension in step 97A may be an AEI CD of a patterned semiconductor structure (not shown) at each of the peripheral zones 200Z at the peripheral region 200B of the first substrate 200. To be specific, first, each of the peripheral zones 200Z at the peripheral region 200B of the first substrate 200 has an AEI CD measurement data measured after a plasma etching process (hereinafter, the AEI CD measurement data of the first substrate 200 are referred to as an AEI CD database). Then, the AEI CD database is transmitted to the data collector 620. Afterwards, the data collector 620 processes the AEI CD database to determine whether the AEI CD database of each of the peripheral zones 200Z is equal to the AEI measurement target.

Step 97B is performed after step 97 and before step 98. In step 97B, whether or not the target temperature for each of the heating areas 311A of the upper ring segments 311 of the upper ring 310 is required to be tuned is determined by the controller 630 based on the AEI CD database detected at a corresponding one of the peripheral zones 200Z at the peripheral region 200B of the first substrate 200. In the case that a defected pattern of the patterned semiconductor structure is a contact hole feature, when the AEI CD database of one of the peripheral zones 200Z at the peripheral region 200B of first substrate 200 is determined to be less than the AEI measurement target, the target temperature of a corresponding one of the heating areas 311A of the upper ring segments 311 is tuned to be higher than the predetermined value of the target temperature set in the recipe in step 92 or determined in step 92B, so as to permit a corresponding one of the peripheral zones 200Z at the peripheral region 200B of the second substrate 200 to be etched at a higher etching rate. On the other hand, when the AEI CD database of one of the peripheral zones 200Z at the peripheral region 200B of the first substrate 200 is determined to be larger than the AEI measurement target, the target temperature of a corresponding one of the heating areas 311A of the upper ring segments 311 is tuned to be less than the predetermined value of the target temperature set in the recipe in step 92 or determined in step 92B, so as to permit a corresponding one of the peripheral zones 200Z at the peripheral region 200B of the second substrate 200 to be etched at a lower etching rate.

After the target temperature for each of the heating areas 311A is determined (the target temperature in step 97B may be tuned or not tuned), the heating areas 311A are heated by the first heating elements 500 in step 98, and two substeps similar to the substeps 93A and 93B are executed repeatedly until the real-time temperature of each of the heating areas 311A is equal to the target temperature determined in step 97B.

In addition, in step 99, the treatment is performed on the second substrate 200 after the real-time temperature of each of the heating areas 311A is, equal to the target temperature set in step 97, determined in a step similar to step 92B, or determined in step 97B.

In some embodiments, the CDU may be improved by controlling a gas (material) distribution and a gas (material) ratio in the treatment performed in step 94 or 99 (for example, but not limited to, a ratio of an etching gas relative to the carrier gas), or controlling a temperature distribution at the main portion 200A of the substrate 200 using the second heating elements 110.

In some embodiments, the methods 2 and 9 can be combined for treating the first substrate 200 and/or the second substrate 200. For example, steps 22 and 23 may be performed between steps 91 and 93 and/or between steps 96 and 98.

In some embodiments, some steps in the method 9 may be modified, replaced, or eliminated without departure from the spirit and scope of the present disclosure. In some alternative embodiments, other suitable methods may also be applied for forming the semiconductor device.

In some alternative embodiments, the device 1 may further include additional features, and/or some features present in the device 1 may be modified, replaced, or eliminated without departure from the spirit and scope of the present disclosure.

The embodiments of the present disclosure have following advantageous features. With the provision of the first heating elements in the device of this disclosure, a temperature at each of peripheral zones at the peripheral region of the substrate can be independently controlled by a corresponding one of the first heating elements. In addition, by moving each of the upper ring segments of the upper ring toward or away from the substrate, a gap between an outer periphery of the substrate and an inner edge of each of the upper ring segments can be adjusted. Moreover, the substrate can be centrally positioned on the substrate retainer using the upper ring segments. Accordingly, the substrate treated using the device of this disclosure can have better critical dimension uniformity, and elements (for example, semiconductor dies) formed on the peripheral zones of the peripheral region of the substrate (such as an edge of a wafer) may have an improved yield rate.

In accordance with some embodiments of the present disclosure, a device includes a substrate retainer for retaining a substrate thereon, and a ring assembly including an upper ring which has a plurality of upper ring segments that are angularly displaced from each other. Each of the upper ring segments is movable between an inner position and an outer position so as to adjust a gap between an outer periphery of the substrate and an inner edge of each of the upper ring segments when the substrate is retained on the substrate retainer.

In accordance with some embodiments of the present disclosure, once the upper ring segments are each moved to the inner position, the inner edges of the upper ring segments are permitted to be brought into contact with the outer periphery of the substrate, thereby centrally positioning the substrate on the substrate retainer.

In accordance with some embodiments of the present disclosure, each of the upper ring segments includes silver, aluminum, silicon, iron, aluminum oxide, or combinations thereof.

In accordance with some embodiments of the present disclosure, the ring assembly further includes a lower ring which includes a plurality of the lower ring segments that are respectively mounted beneath the upper ring segments so as to permit the upper ring segments to move respectively with the lower ring segments.

In accordance with some embodiments of the present disclosure, the device further includes a plurality of heating elements which are disposed between the upper ring and the lower ring, and which are angularly displaced from each other.

In accordance with some embodiments of the present disclosure, the device further includes a control unit which includes a plurality of temperature sensors that are disposed between the upper ring and the lower ring, and that are angularly displaced from each other.

In accordance with some embodiments of the present disclosure, each of the temperature sensors is disposed for detecting a temperature around a corresponding one of the heating elements.

In accordance with some embodiments of the present disclosure, the control unit further includes a data collector which is in signal communication with the temperature sensors so as to collect temperature signals from the temperature sensors, and a controller which is in signal communication with the data collector and the heating elements so as to control operation of each of the heating elements based on a corresponding one of the temperature signals from the temperature sensors.

In accordance with some embodiments of the present disclosure, the device further includes a plurality of jaw chucks which are respectively coupled to the upper ring segments and which are synchronously and radially movable between an inward position, where the upper ring segments are each in the inner position, and an outward position, where the upper ring segments are each in the outer position.

In accordance with some embodiments of the present disclosure, the device further includes a chuck retainer having a plurality of guiding slots, respectively, for slidably receiving the jaw chucks therein so as to permit the jaw chucks to be radially slidable relative to the chuck retainer, and a guiding wheel disposed beneath and coupled to the jaw chucks so as to permit rotation of the guiding wheel to be translated into synchronous and radial movement of the jaw chucks between the inward and outward positions.

In accordance with some embodiments of the present disclosure, the guiding wheel is formed with a spiral groove. Each of the jaw chucks has a plurality of guided teeth engaging the spiral groove so as to permit the jaw chucks to move synchronously and radially in response to rotation of the guiding wheel.

In accordance with some embodiments of the present disclosure, the device further includes a plurality of bevel gear teeth which are formed on an outer periphery of the guiding wheel and which are angularly displaced from each other, a drive gear configured to mesh with the bevel gear teeth so as to drive the guiding wheel to rotate with the drive gear, and a drive motor coupled to drive rotation of the drive gear.

In accordance with some embodiments of the present disclosure, the substrate retainer includes an electrostatic chuck.

In accordance with some embodiments of the present disclosure, a method includes: disposing a substrate on a substrate retainer; setting positions of upper ring segments, which are disposed around the substrate retainer and which are angularly displaced from each other to constitute an upper ring, such that an inner edge of each of the upper ring segments is spaced apart from an outer periphery of the substrate by a predetermined distance; and performing a treatment on the substrate after setting the positions of the upper ring segments.

In accordance with some embodiments of the present disclosure, setting the positions of the upper ring segments includes: moving the upper ring segments from an outer position, where each of the inner edges of the upper ring segments is distal from a center of the substrate retainer, to an inner position, where each of the inner edges of the upper ring segments is proximate to the center of the substrate retainer, so as to permit the inner edges of the upper ring segments to be brought into contact with the outer periphery of the substrate, thereby centrally positioning the substrate on the substrate retainer; and moving the upper ring segments after the substrate is centrally positioned such that the inner edge of each of the upper ring segments is spaced apart from the outer periphery of the substrate by the predetermined distance.

In accordance with some embodiments of the present disclosure, after setting the positions of the upper ring segment, and before performing the treatment, the method further includes generating a clamping force to retain the substrate on the substrate retainer.

In accordance with some embodiments of the present disclosure, the treatment is performed by dry etching.

In accordance with some embodiments of the present disclosure, a method includes: disposing a substrate on a substrate retainer; setting a target temperature for each of heating areas of an upper ring, the upper ring being disposed to surround a peripheral region of the substrate, the heating areas being angularly displaced from each other; heating the heating areas using a plurality of heating elements which are disposed in positions respectively corresponding to the heating areas so as to keep each of the heating areas at the target temperature, thereby heating the peripheral region of the substrate through the heating areas; and performing a treatment on the substrate.

In accordance with some embodiments of the present disclosure, heating the peripheral region of the substrate includes: detecting a temperature at each of detecting positions corresponding respectively to the heating areas; and determining operations of each of the heating elements based on the temperature detected at a corresponding one of the detecting positions.

In accordance with some embodiments of the present disclosure, before heating the peripheral region of the substrate, the method further includes: detecting a critical dimension of each of peripheral zones at the peripheral region of the substrate, the peripheral zones being angularly displaced from each other; and determining whether or not the target temperature for each of the heating areas is required to be tuned based on the critical dimension detected at a corresponding one of the peripheral zones.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    disposing a substrate on a substrate retainer;
    setting positions of upper ring segments which are disposed around the substrate retainer and which are angularly displaced from each other to constitute an upper ring, such that an inner edge of each of the upper ring segments is spaced apart from an outer periphery of the substrate by a predetermined distance; and
    performing a treatment on the substrate after setting the positions of the upper ring segments.

2. The method of claim 1, wherein setting the positions of the upper ring segments includes:
    moving the upper ring segments from an outer position, where each of the inner edges of the upper ring segments is distal from a center of the substrate retainer, to an inner position, where each of the inner edges of the upper ring segments is proximate to the center of the substrate retainer, so as to permit the inner edges of the upper ring segments to be brought into contact with the outer periphery of the substrate, thereby centrally positioning the substrate on the substrate retainer; and
    moving the upper ring segments after the substrate is centrally positioned such that the inner edge of each of the upper ring segments is spaced apart from the outer periphery of the substrate by the predetermined distance.

3. The method of claim 1, after setting the positions of the upper ring segments, and before performing the treatment, further comprising
    generating a clamping force to retain the substrate on the substrate retainer.

4. The method of claim 1, wherein the treatment is performed by dry etching.

5. A method, comprising:
    disposing a substrate on a substrate retainer;
    setting a target temperature for each of heating areas of an upper ring, the upper ring being disposed to surround a peripheral region of the substrate, the heating areas being angularly displaced from each other;
    heating the heating areas using heating elements which are disposed in positions respectively corresponding to the heating areas so as to keep each of the heating areas at the target temperature, thereby heating the peripheral region of the substrate through the heating areas; and
    performing a treatment on the substrate.

6. The method of claim 5, wherein heating the peripheral region of the substrate includes:
    detecting a real-time temperature at each of detecting positions corresponding respectively to the heating areas; and
    determining operations of each of the heating elements based on the real-time temperature detected at a corresponding one of the detecting positions.

7. The method of claim 5, before heating the peripheral region of the substrate, further comprising:
    detecting a critical dimension of each of peripheral zones at the peripheral region of the substrate, the peripheral zones being angularly displaced from each other; and
    determining whether or not the target temperature for each of the heating areas is required to be tuned based on the critical dimension detected at a corresponding one of the peripheral zones.

8. A method, comprising:
    disposing a substrate on a substrate retainer when upper ring segments are set in an outer position, where an inner edge of each of the upper ring segments is separated from an outer periphery of the substrate, the upper ring segments being disposed around the substrate retainer and angularly displaced from each other to constitute an upper ring; and
    moving the upper ring segments from the outer position to an inner position, where the inner edge of each of the upper ring segments is brought into contact with the outer periphery of the substrate, thereby centrally positioning the substrate on the substrate retainer.

9. The method of claim 8, wherein each of the upper ring segments includes silver, aluminum, silicon, iron, aluminum oxide, or combinations thereof.

10. The method of claim 8, wherein
    the movement of the upper ring segments from the outer position to the inner position is driven by moving jaw chucks from an outward position, where the upper ring segments are each in the outer position, to an inward position, where the upper ring segments are each in the inner position, and
    the jaw chucks are respectively coupled to the upper ring segments and are synchronously and radially movable along with the upper ring segments.

11. The method of claim 10, wherein the jaw chucks are respectively slidably received in guiding slots of a chuck retainer, and are coupled to a guiding wheel which is disposed beneath the jaw chucks.

12. The method of claim 11, wherein
    each of the jaw chucks has guided teeth engaging a spiral groove of the guiding wheel, and
    the movement of the jaw chucks from the outward position to the inward position is driven by converting rotation of the guiding wheel into synchronous and radial movement of the jaw chucks.

13. The method of claim 12, wherein
    an outer periphery of the guiding wheel is formed with bevel gear teeth which are angularly displaced from each other,
    the bevel gear teeth is meshed with a drive gear, and
    the rotation of the guiding wheel is driven by rotation of the drive gear.

14. The method of claim 13, wherein the rotation of the drive gear is driven by a drive motor.

15. The method of claim 8, wherein the substrate retainer includes an electrostatic chuck.

16. The method of claim 8, further comprising:
    after the substrate is centrally positioned, moving the upper ring segments from the inner position toward the outer position, so as to separate the upper ring segments from the outer periphery of the substrate.

17. The method of claim 8, further comprising:
heating an peripheral region of the substrate using heating elements which are angularly displaced from each other and which are disposed between the upper ring and a lower ring, the lower ring including lower ring segments which are respectively mounted beneath the upper ring segments so as to permit the upper ring segments to respectively move along with the lower ring segments.

18. The method of claim 17, wherein
during heating of the peripheral region of the substrate, the upper ring includes heating areas which are simultaneously heated by the heating elements, respectively, and the method further comprises:
   detecting a real-time temperature of each of the heating areas using temperature sensors which are respectively located in proximity to the heating elements.

19. The method of claim 18, further comprising:
collecting the real-time temperature of each of the heating areas from the temperature sensors using a data collector, the data collector being in signal communication with the temperature sensors; and determining operations of each of the heating elements based on the real-time temperature of each of the heating areas using a controller, the controller being in signal communication with the data collector.

20. The method of claim 19, wherein a number of the upper ring segments is three.

\* \* \* \* \*